US007994041B2

(12) United States Patent
Lim et al.

(10) Patent No.: US 7,994,041 B2
(45) Date of Patent: Aug. 9, 2011

(54) METHOD OF MANUFACTURING STACKED SEMICONDUCTOR PACKAGE USING IMPROVED TECHNIQUE OF FORMING THROUGH VIA

(75) Inventors: Kwon-Seob Lim, Gwangju-si (KR); Hyun Seo Kang, Gwangju-si (KR)

(73) Assignee: Electronics and Telecommunications Research Institute (KR)

( * ) Notice: Subject to any disclaimer, the term of this patent is extended or adjusted under 35 U.S.C. 154(b) by 190 days.

(21) Appl. No.: 12/410,387

(22) Filed: Mar. 24, 2009

(65) Prior Publication Data

US 2010/0047967 A1 Feb. 25, 2010

(30) Foreign Application Priority Data

Aug. 20, 2008 (KR) .................. 10-2008-0081330

(51) Int. Cl.
*H01L 21/44* (2006.01)
*H01L 21/4763* (2006.01)
*H01L 21/00* (2006.01)

(52) U.S. Cl. . 438/598; 438/109; 438/618; 257/E21.585; 257/E21.705

(58) Field of Classification Search .................. 438/109, 438/598, 618
See application file for complete search history.

(56) References Cited

U.S. PATENT DOCUMENTS

| 6,400,172 | B1 | 6/2002 | Akram et al. |
| 7,119,001 | B2 | 10/2006 | Kang |
| 7,300,857 | B2 | 11/2007 | Akram et al. |
| 2004/0092095 | A1 | 5/2004 | Nguyen et al. |
| 2007/0170576 | A1 | 7/2007 | Lee et al. |
| 2008/0073747 | A1* | 3/2008 | Chao et al. ..................... 257/520 |
| 2008/0164573 | A1* | 7/2008 | Basker et al. .................. 257/621 |

FOREIGN PATENT DOCUMENTS

| JP | 2003-243396 A | 8/2003 |
| KR | 10-2005-0056383 | 6/2005 |
| KR | 10-2006-0020822 A | 3/2006 |
| KR | 10-2007-0046379 A | 5/2007 |
| KR | 10-0775931 B1 | 11/2007 |

OTHER PUBLICATIONS

Ho et al., "Development of Coaxial Shield Via in Silicon Carrier for High Frequency Application," 2006 Electronics Packaging Technology Conference, IEEE, Institute of Microelectronics, 2006, pp. 825-830.
Sekiguchi, et al., "Novel Low Cost Integration of Through Chip Interconnection and Application to CMOS Image Server," 2006 Electronic Components and Technology Conference, IEEE, Toshiba Corporation, 2006, pp. 1367-1374.

* cited by examiner

*Primary Examiner* — Savitri Mulpuri
*Assistant Examiner* — Calvin Choi
(74) *Attorney, Agent, or Firm* — Blakely, Sokoloff, Taylor & Zafman

(57) ABSTRACT

A method of manufacturing a stacked semiconductor package using an improved technique of forming a through via in order to enable 3-dimensional vertical interconnection of stacked packages is provided. The method includes forming a seed layer required for forming a via core on a bottom surface of a wafer, forming at least one via hole vertically through the wafer, forming a via core in the via hole, insulating the via hole from the via core, and removing the seed layer from the bottom surface of the wafer. The stacked semiconductor package is suitable for high-speed signal transmission.

22 Claims, 10 Drawing Sheets

METHOD OF MANUFACTURING STACKED SEMICONDUCTOR PACKAGE USING IMPROVED TECHNIQUE OF FORMING THROUGH VIA

CROSS REFERENCE TO RELATED APPLICATIONS

This application claims priority from Korean Patent Application No. 10-2008-0081330, filed on Aug. 20, 2008, the disclosure of which is incorporated herein in its entirety by reference.

BACKGROUND OF THE INVENTION

1. Background of the Invention

The present invention relates to a semiconductor packaging technique, and more particularly, to a 3-dimensional semiconductor packaging technique of connecting a plurality of chips by forming a hole vertically through a wafer without using a wire-bonding technique.

2. Description of the Related Art

Recent trends in micro-packaging technology reveal demand for inexpensive yet highly efficient, versatile yet smaller packaging. In order to meet such demand, a considerable amount of research has been conducted on new packaging techniques such as SoC (System-on-Chip), SiP (System-in-Package), MCM (Multi-Chip-Module), and SOP (System-on-Package) techniques. In particular, SOP technology mounting an SIP having a stacked structure and various components such as a hetero-material sensor that cannot be formed by a batch process, an electronic device, an SoC, and an optical device in a single package has attracted attention as a stacked semiconductor package suitable for an optical communication system as well as a wireless communication system. Demand for high-efficiency, high-density packages has led to a switchover from 2-dimensional stacked semiconductor packages to 3-dimensional stacked semiconductor packages. Many conventional packages have been tried in an attempt to electrically connect components using a through via, especially, a through silicon via (TSV). Also, a considerable amount of research has focused on a silicon carrier having a TSV in order to embody a fusion technique of integrating a hetero-device with a hetero-substrate.

Conventionally, manufacture of a TSV may include forming a via hole, depositing $SiO_2$ or $Si_3N_4$, coating a seed layer required for a plating process, and forming a via core by plating the via hole with a metal such as copper (Cu). However, in a stacked semiconductor package using the TSV, a sidewall and bottom surface of the via hole are plated at the same time so that the via hole cannot be completely filled with Cu. In addition, since not only the via hole but also the via core have poor surface roughness, signal loss increases due to a skin effect and semiconductor characteristics of a silicon substrate, and waveform distortion and electrical crosstalk also happen. Accordingly, in order to enable high-speed signal transmission, signal power loss, waveform distortion, and electrical crosstalk must be minimized. Therefore, a method of depositing a $SiO_2$ or $Si_3N_4$ layer using an oxidation process or a chemical vapor deposition (CVD) process is being widely employed. However, since this method makes the $SiO_2$ or $Si_3N_4$ layer too thin, it is restricted to low-speed signal transmission systems or modules.

SUMMARY OF THE INVENTION

The present invention provides a method of manufacturing a stacked semiconductor package suitable for high-speed signal transmission.

Additional aspects of the invention will be set forth in the description which follows, and in part will be apparent from the description, or may be learned by practice of the invention.

The present invention discloses a method of manufacturing a stacked semiconductor package using an improved process of forming a through via, including: forming a seed layer required for forming a via core on a bottom surface of a wafer; forming at least one via hole vertically through the wafer; forming a via core in the via hole; insulating the via hole from the via core; and removing the seed layer from the bottom surface of the wafer.

The method may further include: adhering a handler to a bottom surface of the seed layer; and removing the handler after insulating the via hole from the via core.

The forming of the via hole may include: depositing a mask on the wafer; patterning the deposited mask; forming a via hole using a deep reactive ion etching (DRIE) process; and removing the deposited mask.

The forming of the via core may include: coating a photoresist on the wafer having the via hole and patterning the photoresist to form a photoresist hole in the via hole; plating the photoresist hole from bottom to top with a metal to form the via core; and removing the coated photoresist.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the aspects of the invention.

FIG. 5 3-dimensionally illustrates a portion of the stacked semiconductor package shown in FIG. 4.

DETAILED DESCRIPTION OF EXEMPLARY EMBODIMENTS

Figure 1:
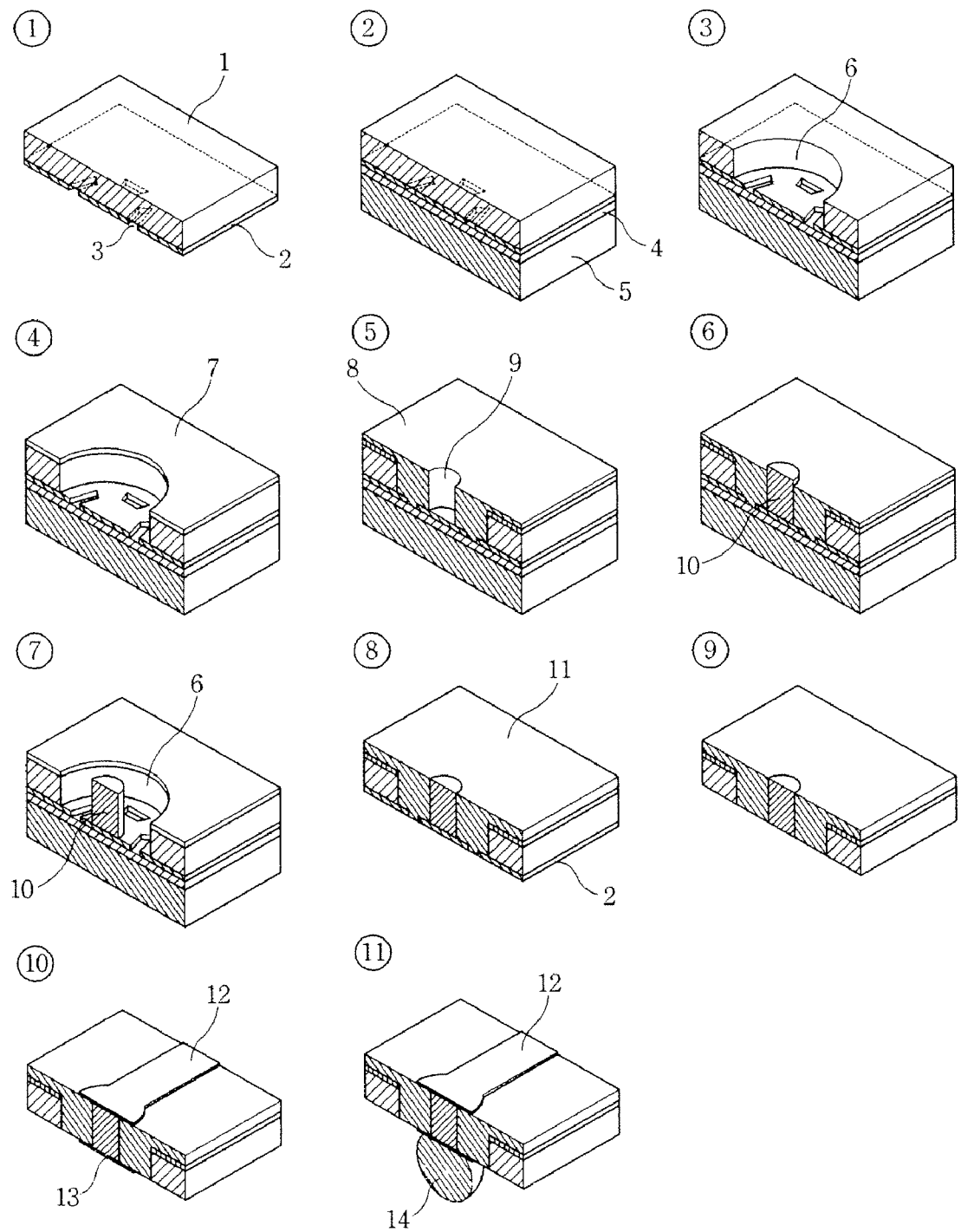
FIG. 1 shows a process of forming a through via having a thick insulating structure according to an exemplary embodiment of the present invention.

The invention is described more fully hereinafter with reference to the accompanying drawings, in which exemplary embodiments of the invention are shown. This invention may, however, be embodied in many different forms and should not be construed as limited to the is exemplary embodiments set forth herein. Rather, these exemplary embodiments are provided so that this disclosure is thorough, and will fully convey the scope of the invention to those skilled in the art. In the drawings, the relative sizes of layers and regions may be exaggerated for clarity, and like reference numerals denote like elements.

FIG. 1 shows a process of forming a through via having a thick insulating structure according to an exemplary embodiment of the present invention.

To begin with, a wafer 1 may be formed to a predetermined thickness. In the present specification, wafer refers to a semiconductor wafer or an insulating substrate. In an exemplary embodiment, the wafer 1 may be formed using a chemical mechanical polishing (CMP) process. In another exemplary embodiment, the wafer 1 may be formed using a dry etching process or a wet etching process. After the wafer 1 is formed to the predetermined thickness, a seed layer 2 may be formed using various techniques such as an evaporation process, a sputtering process, or a plating process (①). As shown in FIG. 1, the seed layer 2 may have at least one hole 3 to facilitate a thick insulating layer forming process.

After the seed layer 2 is formed, a handler 5 such as a transparent glass may be adhered to a bottom surface of the wafer 1 using an adhesive 4 in order to prevent shock and contamination during subsequent processes and to support the thin wafer 1 (②). Thereafter, a via hole 5 may be formed in the wafer 1 (③). In an exemplary embodiment, a SiO$_2$ mask may be deposited on a top surface of the wafer 1. In order to pattern the SiO$_2$ mask, a photoresist may be coated, exposed, and patterned. Thereafter, the SiO$_2$ mask may be patterned using a dry etching process and the photoresist may be removed. The via hole 5 may then be formed using a deep reactive ion etching (DRIE) process. In another exemplary embodiment, the via hole 5 may be formed using a laser drilling process without the SiO$_2$ mask process. In this case, the process of depositing and patterning the SiO$_2$ mask may be omitted.

After the via hole 6 is formed, the SiO$_2$ mask may be removed using a buffered oxide etching (BOE) process. In order to form a microstrip-type or grounded coplanar waveguide (CPWG)-type transmission line on the top surface of the wafer 1, a photoresist process may be performed and a ground layer 7 may be formed (④). Alternatively, in order to form a coaxial-cable-type through via, an additional seed layer may be formed on the top surface of the wafer 1 and a sidewall and bottom surface of the via hole 6 without performing a photoresist process.

After the ground layer 7 or the additional seed layer is formed, a via core may be formed in the via hole 6. In an exemplary embodiment, a photoresist 8 may be coated and exposed, and a photoresist hole 9 for shaping the via core may be formed (⑤). Afterwards, the photoresist hole 9 may be plated from bottom to top with a metal such as Cu to form a via core 10 (⑥). In another exemplary embodiment, after the photoresist hole 9 is formed, it may be filled with solder paste to form the via core 10 (⑥).

Thereafter, the photoresist 8 and the handler 5 may be removed (⑦). In order to provide insulation between the via hole 6 and the via core 10, an insulating material 11 may be sucked from below the seed layer 2 using a hole formed in the seed layer 2 so as to fill a space between the via hole 6 and the via core 10. In this case, the insulating material 11 may have a good insulation characteristic and a dielectric constant that is low enough to reduce loss. For example, the insulating material 11 may be benzocyclobutene (BCB) or polyimide (PI). Thereafter, in order to enable electrical connection of a top surface of the via core 9 with a transmission line and a solder bump that will be formed later, the insulating material 11 may be removed from the top surface of the via core 9 using a CMP process or a dry etching process so that the top surface of the via core 9 can be exposed (⑧). Subsequently, the seed layer 2 formed on the bottom surface of the wafer 1 may be back-ground using a CMP process, thereby forming a through via having a thick insulating structure (⑨).

Thereafter, a transmission line 12 required for signal transmission may be formed on the insulating material 11 (⑩). The transmission line 12 may have an under bump metallurgy (UBM) shape. Also, passive devices such as a resistor, an inductor, and a capacitor, and electrical wirings, may be provided on the wafer 1 having the through via in order to form a stacked semiconductor package (e.g., a silicon carrier) required for 3-dimensional integration of a hetero-device with a hetero-substrate. In the present specification, a stacked semiconductor package includes a package including a silicon carrier.

After the transmission line 12 is formed, a via pad 13 may be formed on the bottom surface of the wafer 1 (⑩). The via pad 13 may have a UBM shape in order to flip-chip bond the wafer 1 with another wafer. Finally, the wafer 1 may be vertically connected with the other wafer by a flip-chip bonding process using a solder ball 14 (⑫).

In the above exemplary embodiment, it is described that the transmission line 12 may be formed as a microstrip type or CPWG type and the through via also may be formed as a coaxial-cable type. In another exemplary embodiment, the transmission line 12 may be formed as a coplanar waveguide (CPW) type so that a ground and a signal line may be located on the same plane. In this case, step ④ may be omitted, and a CPW-type transmission line may be formed on the insulating material 11 in step ⑩.

Figure 2:
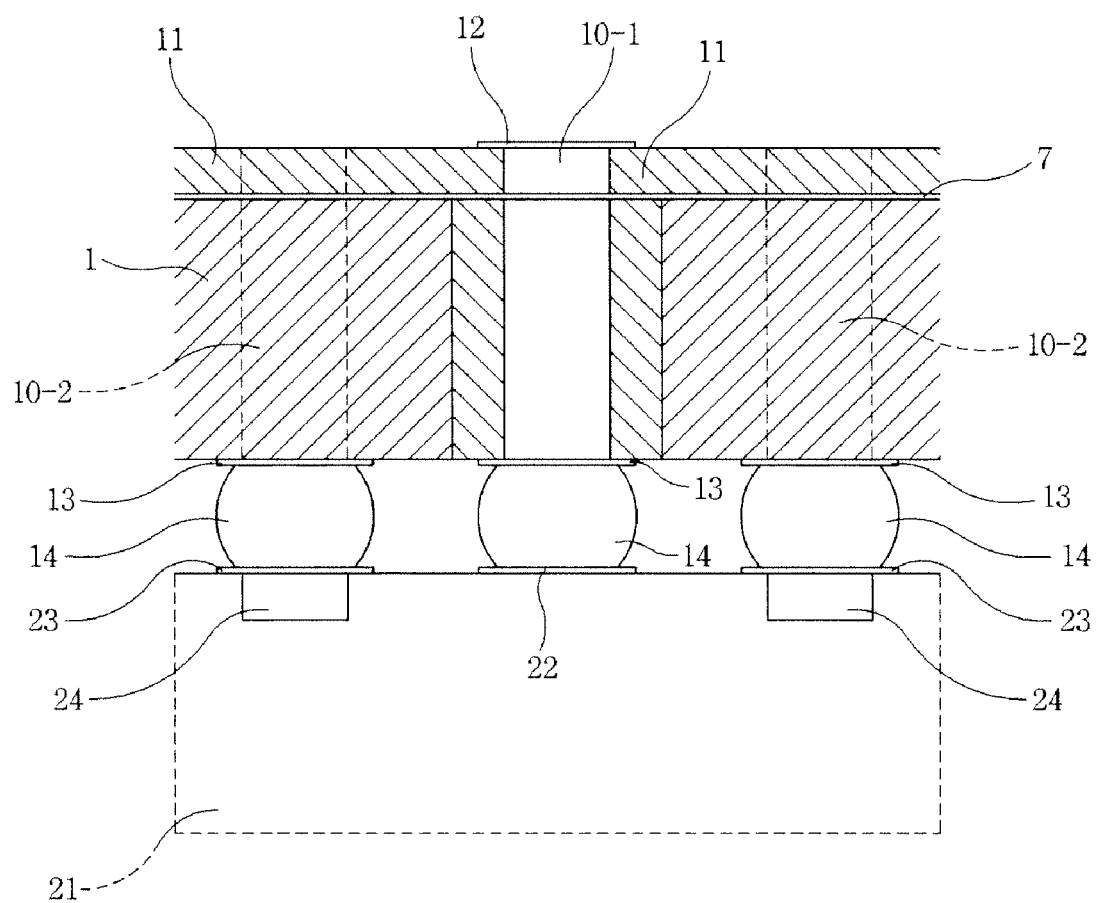
FIG. 2 illustrates a stacked semiconductor package obtained by vertically connecting the wafer including the through via having the thick insulating structure shown in FIG. 1 with another wafer according to an exemplary embodiment of the present invention.
Figure 3:
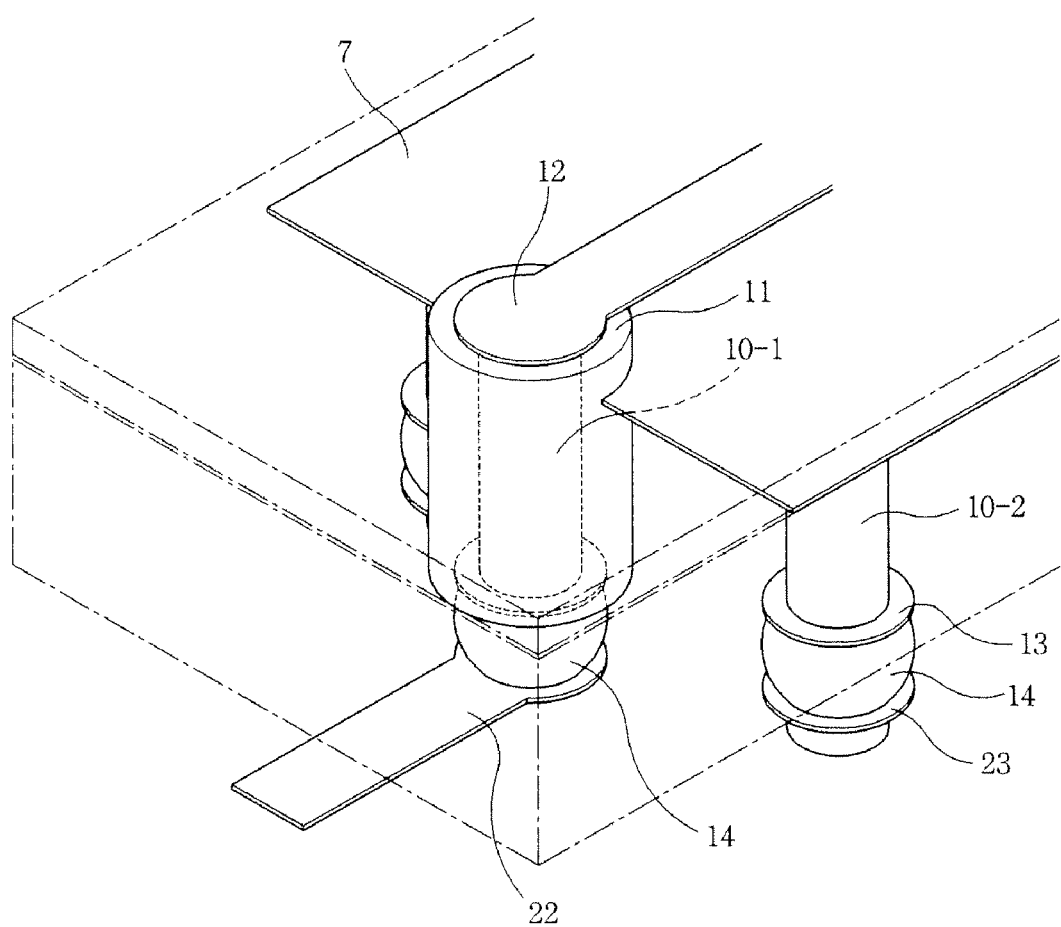
FIG. 3 3-dimensionally illustrates a portion of the stacked semiconductor package shown in FIG. 2.

FIG. 2 illustrates a stacked semiconductor package obtained by vertically connecting the wafer including the through via having the thick insulating structure shown in FIG. 1 and another wafer according to an exemplary embodiment of the present invention, and FIG. 3 3-dimensionally illustrates a portion of the stacked semiconductor package shown in FIG. 2.

Referring to FIG. 2, the transmission line 12 is formed as a microstrip type on the silicon wafer 1 according to an exemplary embodiment of the present invention. The via core 10 may be classified into a signal transmission via core 10-1 and a ground via core 10-2. Also, each of via pads 13 may be connected to a via pad 22 and a transmission line 23 of another wafer 21 through the solder ball 14. In FIG. 2, reference numeral 24 denotes a ground via core of the wafer 21.

Figure 4:
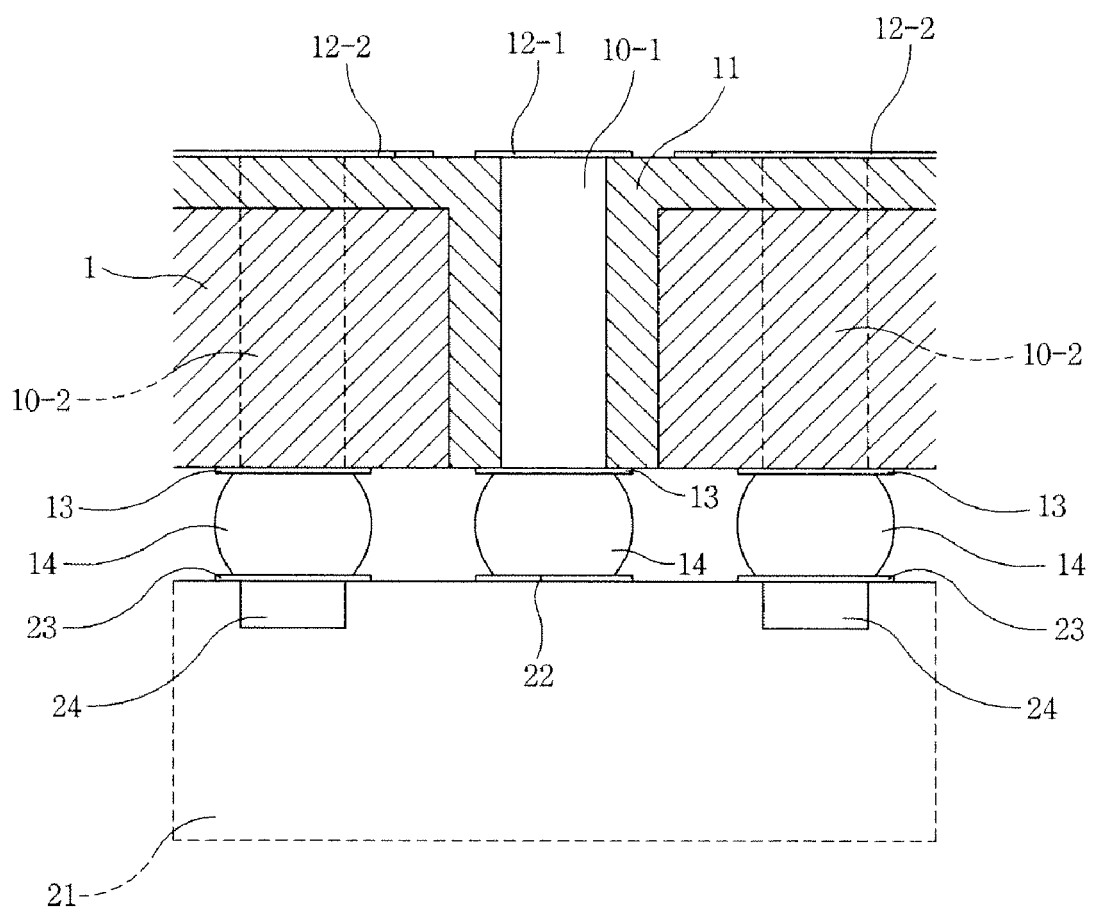
FIG. 4 illustrates a stacked semiconductor package obtained by vertically connecting the wafer including the through via having the thick insulating structure shown in FIG. 1 with another wafer according to another exemplary embodiment of the present invention.
Figure 5:
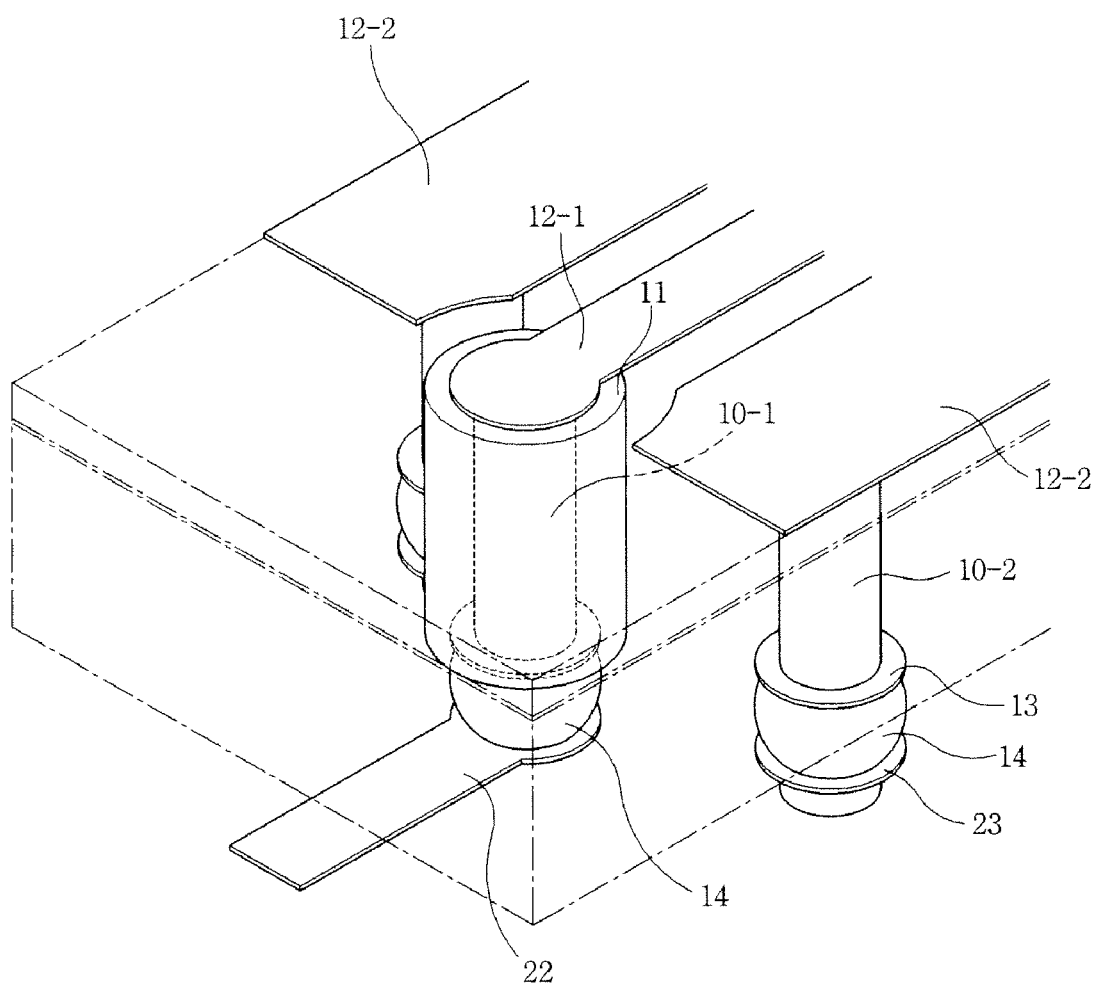

FIG. 4 illustrates a stacked semiconductor package obtained by vertically connecting the wafer including the through via having the thick insulating structure shown in FIG. 1 with another wafer according to another exemplary embodiment of the present invention, and FIG. 5 3-dimensionally illustrates a portion of the stacked semiconductor package shown in FIG. 4.

Referring to FIG. 4, a transmission line 12-1 and 12-2 is formed as a CPWG type on the silicon wafer 1 according to another exemplary embodiment of the present invention.

Figure 6:
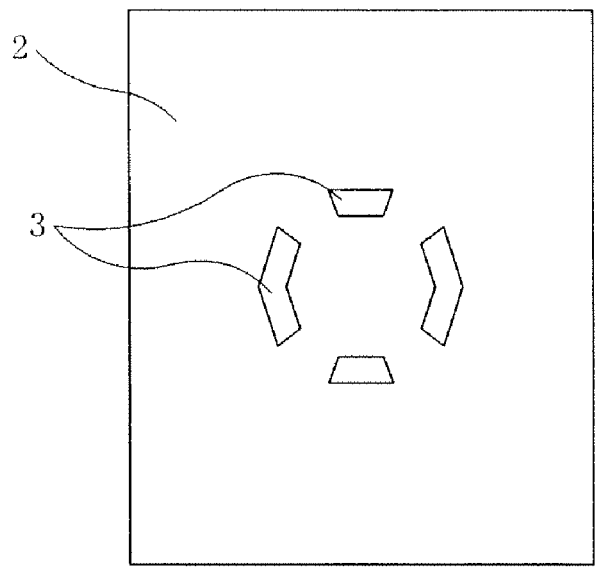
FIG. 6 is a plan view of a portion of a seed layer shown in FIG. 1.
Figure 7:
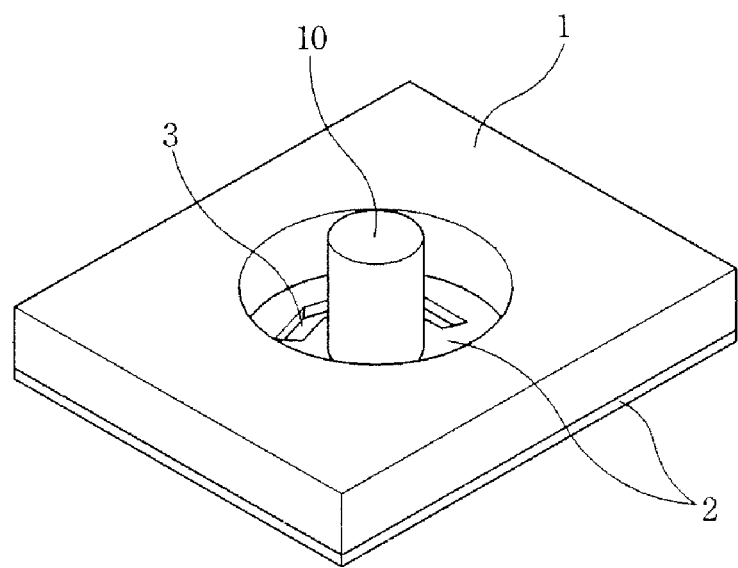
FIG. 7 is a partial perspective view of the wafer in which a via core is formed as shown in FIG. 1.

FIG. 6 is a plan view of a portion of the seed layer shown in FIG. 1, and FIG. 7 is a partial perspective view of the wafer in which the via core is formed as shown in FIG. 1. Referring to FIG. 7, the seed layer 2 is formed on the bottom surface of the wafer 1. A plurality of holes 3 may be formed vertically through the seed layer 2 and located within the via hole 6 so that the insulating material 11 can be filled in the space between the via core 10 and the via hole 6 through the holes 3.

Figure 8:
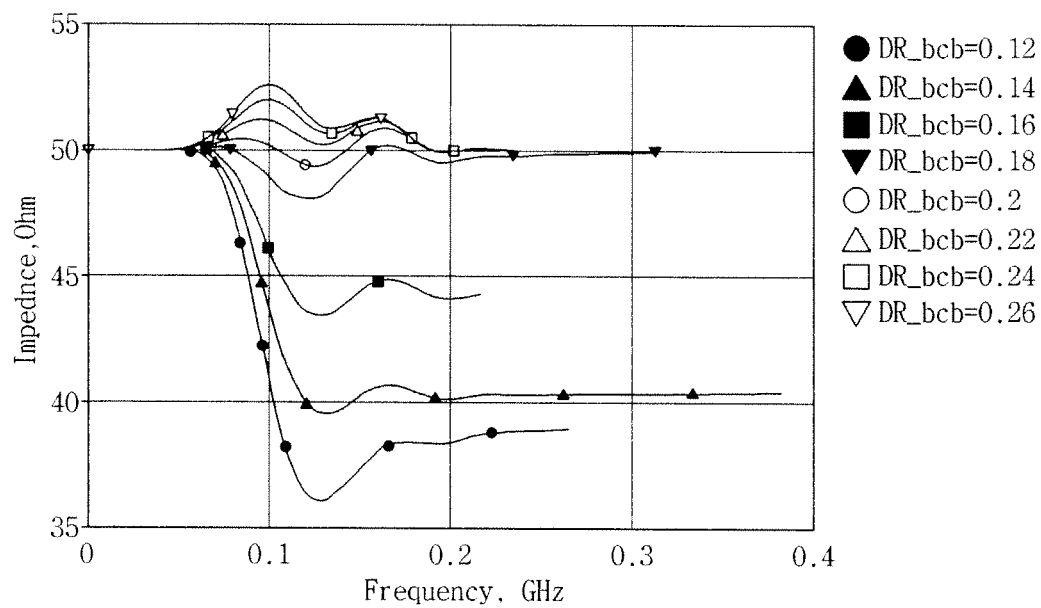
FIG. 8 is a graph of analysis results showing a time-domain reflectometry (TDR) waveform relative to the thickness of a thick insulating material in a stacked semiconductor package including a through via having a thick insulating structure according to an exemplary embodiment of the present invention.

FIG. 8 is a graph of analysis results showing a time-domain reflectometry (TDR) waveform relative to the thickness of a thick insulating material in a stacked semiconductor package including a through via having a thick insulating structure according to an exemplary embodiment of the present invention. Specifically, the stacked semiconductor package included a silicon wafer 1 having the through via with the thick insulating structure and a low-temperature co-fired ceramic (LTCC) substrate (refer to 21 in FIGS. 2 and 4), and the thick insulating material 11 was filled between a via core 9 and a via hole 8 of the stacked semiconductor package. Referring to FIG. 8, it can be seen that, like a stacked semiconductor package having a coaxial-cable-type through via, impedance matching is enabled by controlling the thickness of the insulating material 11. In FIG. 8, reference character DR_bcb denotes the outer radius of the insulating material 11.

Figure 9:
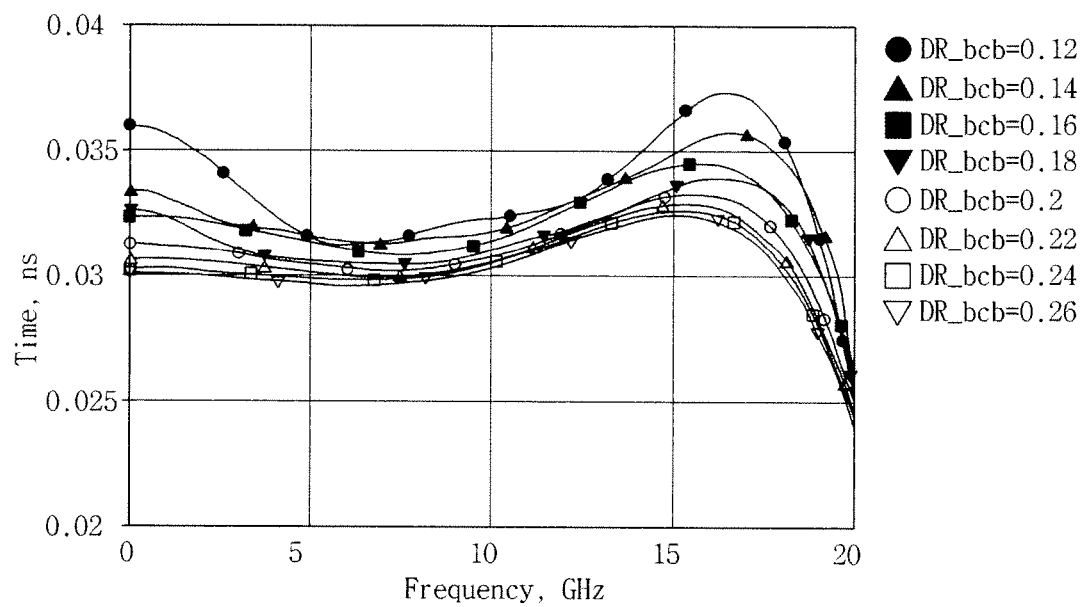
FIG. 9 is a graph of analysis results showing a group delay relative to the thickness of a thick insulating material in a stacked semiconductor package including a through via having a thick insulating structure according to an exemplary embodiment of the present invention.

FIG. 9 is a graph of analysis results showing a group delay relative to the thickness of a thick insulating material in a stacked semiconductor package including a through via having a thick insulating structure according to an exemplary embodiment of the present invention. The stacked semiconductor package included a silicon wafer 1 having the through via with the thick insulating structure and an LTCC substrate 21, and the thick insulating material 11 was filled between a via core 9 and a via hole 8 of the stacked semiconductor package.

Figure 10:
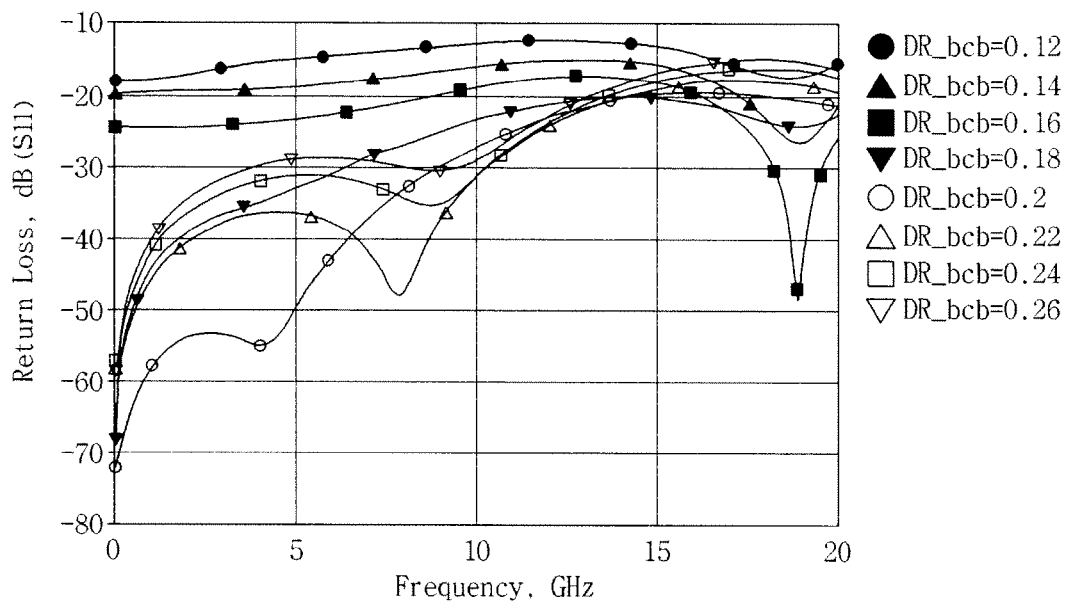
FIG. 10 is a graph of analysis results showing return loss relative to the thickness of a thick insulating material in a stacked semiconductor package including a through via having a thick insulating structure according to an exemplary embodiment of the present invention.

FIG. 10 is a graph of analysis results showing return loss S11 relative to the thickness of a thick insulating material in a stacked semiconductor package including a through via having a thick insulating structure according to an exemplary embodiment of the present invention. The stacked semiconductor package included a silicon wafer 1 having the through via with the thick insulating structure and an LTCC substrate 21, and the thick insulating material 11 was filled between a via core 9 and a via hole 8 of the stacked semiconductor package.

Figure 11:
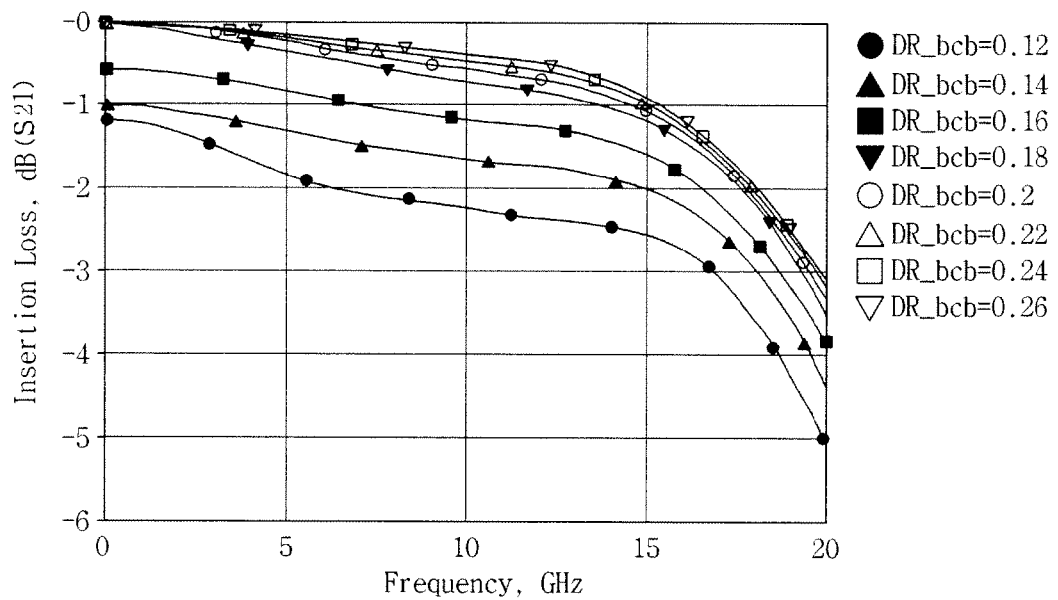
FIG. 11 is a graph of analysis results showing insertion loss relative to the thickness of a thick insulating material in a stacked semiconductor package including a through via having a thick insulating structure according to an exemplary embodiment of the present invention.

FIG. 11 is a graph of analysis results showing insertion loss S21 relative to the thickness of a thick insulating material in a stacked semiconductor package including a through via having a thick insulating structure according to an exemplary embodiment of the present invention. The stacked semiconductor package included a silicon wafer 1 having the through via with the thick insulating structure and an LTCC substrate 21, and the thick insulating material 11 was filled between a via core 9 and a via hole 8 of the stacked semiconductor package.

Figure 12:
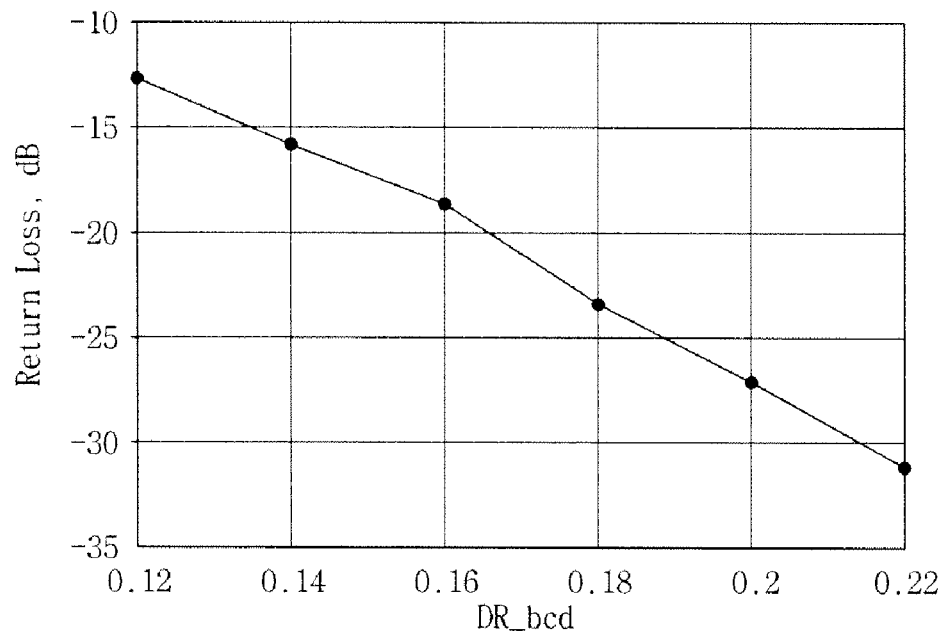
FIG. 12 is a graph of analysis results showing return loss relative to the thickness of a thick insulating material at a frequency of 10 GHz in a stacked semiconductor package including a through via having a thick insulating structure according to an exemplary embodiment of the present invention.

FIG. 12 is a graph of analysis results showing return loss relative to the thickness of a thick insulating material at a frequency of 10 GHz in a stacked semiconductor package including a through via having a thick insulating structure according to an exemplary embodiment of the present invention. The stacked semiconductor package included a silicon wafer 1 having the through via with the thick insulating structure and an LTCC substrate 21, and the thick insulating material 11 was filled between a via core 9 and a via hole 8 of the stacked semiconductor package.

Figure 13:
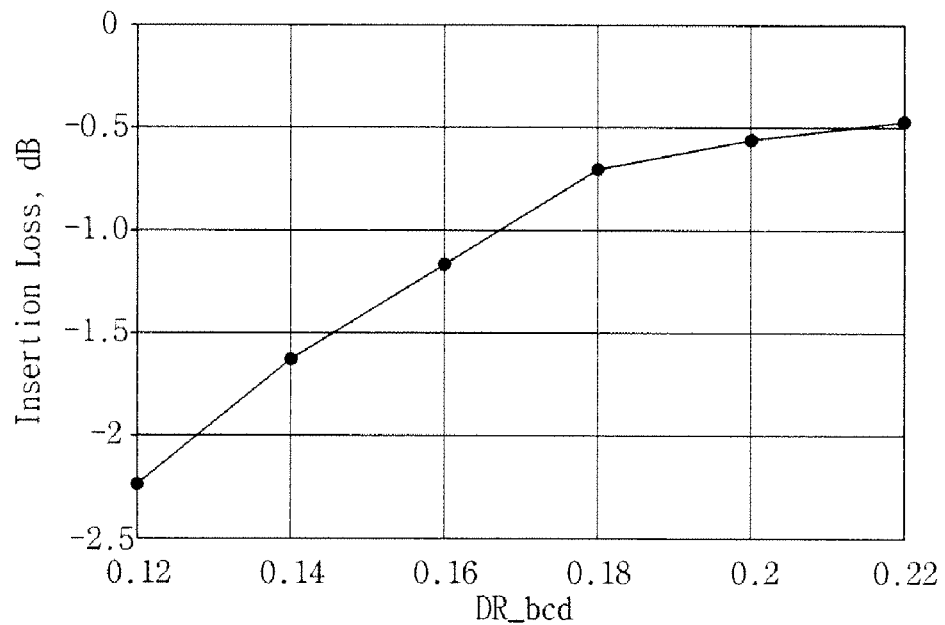
FIG. 13 is a graph of analysis results showing insertion loss relative to the thickness of a thick insulating material at a frequency of 10 GHz in a stacked semiconductor package including a through via having a thick insulating structure according to an exemplary embodiment of the present invention.

FIG. 13 is a graph of analysis results showing insertion loss relative to the thickness of a thick insulating material at a frequency of 10 GHz in a stacked semiconductor package including a through via having a thick insulating structure according to an exemplary embodiment of the present invention. The stacked semiconductor package included a silicon wafer 1 having the through via with the thick insulating structure and an LTCC substrate 21, and the thick insulating material 11 was filled between a via core 9 and a via hole 8 of the stacked semiconductor package.

Figure 14:
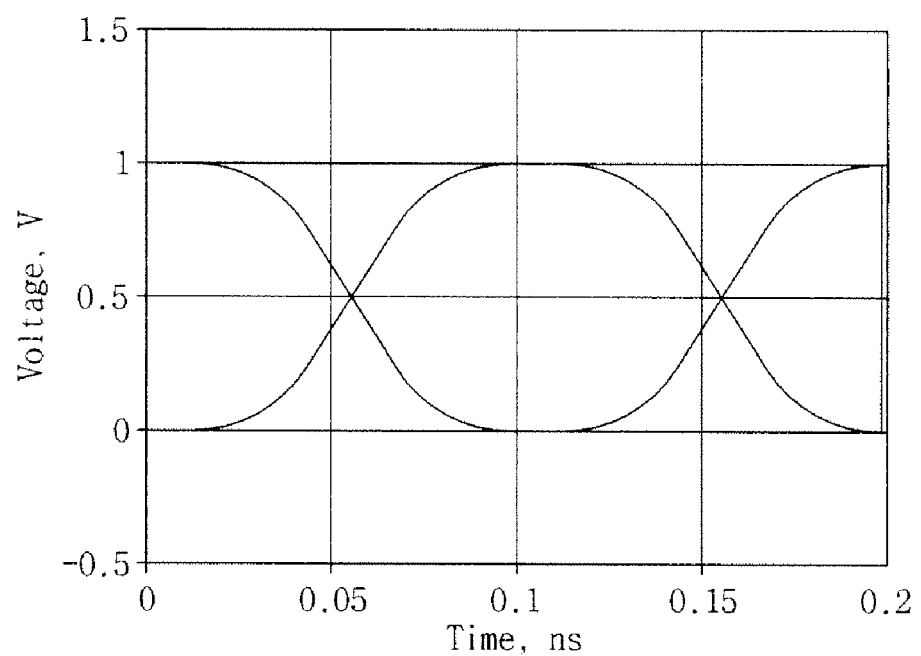
FIG. 14 is a graph showing analysis results of an eye diagram at a transmission rate of 10 Gbps in a stacked semiconductor package including a through via having a thick insulating structure according to an exemplary embodiment of the present invention.

FIG. 14 is a graph showing analysis results of an eye diagram at a transmission rate of 10 Gbps in a stacked semiconductor package including a through via having a thick insulating structure according to an exemplary embodiment of the present invention. The stacked semiconductor package included a silicon wafer 1 having the through via with the thick insulating structure and an LTCC substrate 21.

As can be seen from FIGS. 8 through 14, the through via having the thick insulating structure according to the present invention enables impedance matching, has low-loss and low-return characteristics, and minimizes electrical crosstalk between a transmission and a via so that it can be applied to high-speed signal transmission systems.

As apparent from the above description, a through via having a thick insulating structure according to the present invention enables impedance matching, has low-loss and low-return characteristics, and minimizes electrical crosstalk between a transmission and a via so that it can be applied to high-speed signal transmission systems.

Also, since a via core is formed by plating a photoresist hole from bottom to top only with a metal, incomplete filling of the photoresist hole, clogging of an intermediate portion, and formation of cavities can be prevented, and the surface roughness of the via core can be minimized.

Furthermore, a thick insulating layer can be completely filled between a via hole and the via core by sucking an insulating material from below a metal layer having an arbitrary pattern formed on a bottom surface of a wafer using a hole formed through the metal layer.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A method of manufacturing a stacked semiconductor package using an improved process of forming a through via, the method comprising:
   forming a seed layer required for forming a via core on a bottom surface of a wafer;
   forming at least one via hole vertically through the wafer;
   coating a photoresist on the wafer having the via hole and patterning the photoresist to form a photoresist hole in the via hole;
   filling the photoresist hole from bottom to top to form the via core in the via hole;
   removing the coated photoresist;
   insulating the via hole from the via core; and
   removing the seed layer from the bottom surface of the wafer.

2. The method of claim 1, further comprising forming the wafer to a predetermined thickness before forming the seed layer.

3. The method of claim 2, wherein the forming of the wafer to a predetermined thickness is performed using one selected from the group consisting of a chemical mechanical polishing (CMP) process, a dry etching process, and a wet etching process.

4. The method of claim 1, further comprising:
   adhering a handler to a bottom surface of the seed layer; and
   removing the handler after insulating the via hole from the via core.

5. The method of claim 1, wherein the forming of the via hole comprises:
   depositing a mask on the wafer;
   patterning the deposited mask;
   forming the via hole using a deep reactive ion etching (DRIE) process; and
   removing the deposited mask.

6. The method of claim 1, wherein the forming of the via hole is performed using a laser drilling process.

7. The method of claim 1, wherein filling the photoresist hole comprises:
   plating the photoresist hole from bottom to top with a metal to form the via core.

8. The method of claim 7, further comprising forming a ground layer on a top surface of the wafer after forming the via hole and before forming the via core.

9. The method of claim 7, further comprising forming an additional seed layer on a top surface of the wafer and a sidewall and bottom surface of the via hole after forming the via hole and before forming the via core.

10. The method of claim 1, wherein filling the photoresist hole comprises:
    filling the photoresist hole with solder paste to form the via core.

11. The method of claim 10, further comprising forming a ground layer on a top surface of the wafer after forming the via hole and before forming the via core.

12. The method of claim 10, further comprising forming an additional seed layer on a top surface of the wafer and a sidewall and bottom surface of the via hole after forming the via hole and before forming the via core.

13. The method of claim 1, wherein the insulating of the via hole from the via core comprises filling a space between the via hole and the via core with an insulating material.

14. The method of claim 13, wherein the seed layer formed on the bottom surface of the wafer comprises at least one hole formed vertically through the seed layer and exposed by the via hole, and
    wherein the insulating of the via hole from the via core comprises sucking the insulating material from below the seed layer using the hole formed through the seed layer.

15. The method of claim 13, further comprising removing the insulating material from a top surface of the via core.

16. The method of claim 1, wherein the removing of the seed layer comprises back-grinding the wafer.

17. The method of claim 1, further comprising forming a transmission line or a via pad contacting the via core on an insulating layer formed by insulating the via hole from the via core.

18. The method of claim 17, wherein the forming of the transmission line or the via pad comprises forming the transmission line or the via pad as an under bump metallurgy (UBM) type.

19. The method of claim 1, further comprising mounting or integrating an electrical wiring, a passive device, or an active device using a thin film forming process on an insulating layer formed by insulating the via hole from the via core.

20. The method of claim 1, further comprising forming a via pad contacting the via core on the bottom surface of the wafer from which the seed layer is removed.

21. The method of claim 20, wherein the forming of the via pad comprises forming the via pad as a UMB type.

22. The method of claim 20, further comprising bonding the via pad with a via pad of another stacked package using a solder ball to vertically connect the stacked package with the other stacked package.

* * * * *